(12) United States Patent
Lamantia

(10) Patent No.: US 9,280,043 B2
(45) Date of Patent: Mar. 8, 2016

(54) METHOD FOR REPAIRING MASK FOR EUV EXPOSURE AND MASK FOR EUV EXPOSURE

(71) Applicant: TOPPAN PRINTING CO., LTD., Tokyo (JP)

(72) Inventor: Matthew Joseph Lamantia, Georgetown, TX (US)

(73) Assignee: TOPPAN PRINTING CO., LTD., Tokyo (JP)

( * ) Notice: Subject to any disclaimer, the term of this patent is extended or adjusted under 35 U.S.C. 154(b) by 170 days.

(21) Appl. No.: 13/970,380

(22) Filed: Aug. 19, 2013

(65) Prior Publication Data

US 2013/0330661 A1    Dec. 12, 2013

Related U.S. Application Data

(63) Continuation-in-part of application No. PCT/JP2012/057340, filed on Mar. 22, 2012.

(30) Foreign Application Priority Data

Mar. 31, 2011    (JP) .................................. 2011-080112

(51) Int. Cl.
  *G03C 1/22*    (2006.01)
  *G03F 1/22*    (2012.01)
  (Continued)

(52) U.S. Cl.
  CPC . *G03F 1/22* (2013.01); *B82Y 10/00* (2013.01); *B82Y 40/00* (2013.01); *G03F 1/24* (2013.01); *G03F 1/72* (2013.01); *G03F 1/74* (2013.01)

(58) Field of Classification Search
  CPC ..................................... G03F 1/22; G03F 1/24
  USPC .............................................................. 430/5
  See application file for complete search history.

(56) References Cited

U.S. PATENT DOCUMENTS

| 2004/0131947 A1 | 7/2004 | Fisch Gallagher et al. |
| 2005/0185173 A1 | 8/2005 | Hau-Riege |

(Continued)

FOREIGN PATENT DOCUMENTS

| JP | 2004-510343 | 4/2004 |
| JP | 2006-59835 | 3/2006 |

(Continued)

OTHER PUBLICATIONS

Extended European Search Report dated Aug. 7, 2014 in corresponding European Patent Application No. 12765886.2.

(Continued)

*Primary Examiner* — Stephen Rosasco

(57) ABSTRACT

A mask for EUV exposure and a method for repairing a mask for EUV exposure. The mask includes: a Mo/Si multi-layer film including a molybdenum layer and a silicon layer and being deposited on a substrate; a protection film formed on the Mo/Si multi-layer film; an absorption film formed on the protection film; and a reflectivity enhancing portion having a plurality of holes in the protection film. The method includes: specifying a position of a defect of the Mo/Si multi-layer film in an area of the protection film; and irradiating light beam, of which a diameter is narrowed down to be at or less than a wavelength of EUV exposure light, onto an area covering the position of the defect in a plan view of the mask for EUV exposure to form the reflectivity enhanced portion. The maximum width of the holes is equal to or less than the wavelength.

7 Claims, 3 Drawing Sheets

(51) Int. Cl.
  *G03F 1/24* (2012.01)
  *G03F 1/74* (2012.01)
  *G03F 1/72* (2012.01)
  *B82Y 10/00* (2011.01)
  *B82Y 40/00* (2011.01)

(56) References Cited

U.S. PATENT DOCUMENTS

2006/0040418 A1 2/2006 Takaoka
2009/0297988 A1 12/2009 Tanaka

FOREIGN PATENT DOCUMENTS

| JP | 2006-60059 | 3/2006 |
| JP | 2009-10373 | 1/2009 |
| JP | 2010-34129 | 2/2010 |
| WO | WO 02/27404 A2 | 4/2002 |
| WO | WO 03/003119 A1 | 1/2003 |

OTHER PUBLICATIONS

"Investigation of multilayer structural changes in phase and amplitude-defects correction process", Lee et al., Journal of Vacuum Science and Technology B 23(6), American Vacuum Society, Nov./Dec. 2005, pp. 2866-2869.

"Compensation methods for buried defects in extreme ultraviolet lithography masks", Clifford et al., Journal of Vacuum Science and Technology B 29(1), American Vacuum Society, Jan./Feb. 2011, 6 pp.

"Compensation for EUV multilayer defects within arbitrary layouts by absorber pattern modification", Pang et al., Extreme Ultraviolet (EUV) Lithography II, vol. 7969, Mar. 17, 2011, 14 pp.

International Search Report mailed May 1, 2012 in corresponding International Application No. PCT/2012/057340.

Chinese Office Action dated May 26, 2015 in corresponding Chinese Patent Application No. 201280014146.0.

METHOD FOR REPAIRING MASK FOR EUV EXPOSURE AND MASK FOR EUV EXPOSURE

CROSS REFERENCE TO RELATED APPLICATIONS

This application is a continuation-in-part application based on a PCT Patent Application No. PCT/JP2012/057340, filed Mar. 22, 2012, whose priority is claimed on Japanese Patent Application No. 2011-080112, filed Mar. 31, 2011, the entire content of which are hereby incorporated by reference.

BACKGROUND OF THE INVENTION

1. Field of the Invention

The present invention relates to a mask for EUV (Extreme Ultra Violet) exposure and a method for repairing a mask for EUV exposure. Specifically, the present invention relates to a method for repairing defects developed in a multi-layer film of a mask for EUV exposure.

2. Description of the Related Art

In order to further reduce feature sizes for semiconductor devices, other lithography methods have been recently suggested, such as direct writing with an electron beam writer (EB), cell projection, and soft X-ray reduction exposure (Extreme Ultra Violet Lithography: EUVL).

In particular, EUVL, which is a photolithography technology that utilizes a reflective optical system with soft X-rays having a wavelength of approximately 13-14 nanometer (nm), has attracted attention since it is considered to be the utmost short-wavelength limit in performing exposure with ultraviolet light.

A mask for use in EUVL has: a Mo/Si multi-layer film which is formed by alternately depositing a molybdenum and a silicon on a quartz substrate; an absorber such as TaN and TiN; and a buffer layer formed from Ruthenium (Ru), silicon dioxide (SiO2), chrome (Cr), or the like between the Mo/Si multi-layer film and the absorber, in which patterns are formed on the absorber to form a reflective mask. The thickness and film-forming condition of the Mo/Si multi-layer film are optimized based on the illuminating conditions (i.e. wavelength) and the stress balance due to thermal load.

When defects are present on the surface of the EUVL mask substrate or within the Mo/Si multi-layer, even if the defects would be a negligible for conventional photomasks, the defects may adversely affect the optical path and thus be fatal.

In particular, the defects in the Mo/Si multi-layer film include amplitude defects which cause the reduction in intensity of reflected EUV light due to foreign matter contamination in the vicinity of the surface of the multi-layer film and phase defects which are caused by propagation of a concave or convex shape in the multi-layer film surface associated with the change of the inner structure of the multi-layer film due to foreign matter on the substrate, foreign matter contamination in an early stage of the formation of the Mo/Si multi-layer film or surface defects known as pits or divots in the substrate surface.

Since the amplitude defects and phase defects may cause wafer yield degradation during wafer printing, they need to be removed before the formation of the absorber and buffer layer by performing defect repair.

With regard to such defect repair, Japanese Patent Application, First Publication No. 2006-059835 (hereinafter, referred to as Patent Document 1) describes that an electron beam or the like is locally irradiated onto a foreign matter present in the multi-layer film to form silicide at the irradiation portion for eliminating difference in level caused due to volume contraction.

In addition, Japanese Patent Application, First Publication No. 2006-060059 (hereinafter, referred to as Patent Document 2) describes that laser light having a wavelength at which the light is not absorbed by a glass substrate is converged and irradiated onto a foreign matter present on the glass substrate from the rear surface thereof and then it is heated to form silicide at the interface of the Mo/Si multi-layer film for mitigating difference in level on the Mo/Si multi-layer film.

In EUVL, the reflection efficiency of the multi-layer film is limited by the structural factors and the optical properties of the film layers. For this reason, there is a demand to increase the reflectivity of the multi-layer film. In this regard, particles located between the layers of the multi-layer film or under the multi-layer film or surface defects in the substrate surface, impact the topography of each deposited multi-layer, or variations of the optical properties of the materials may cause defects in the multi-layer film structure and/or non-uniformity of the film thickness, which result in a reduction in reflected light intensity.

The intensity of reflected EUV energy is significantly affected by the above-described factors, and changes in reflectivity may appear as an under exposed image on a wafer during the photolithography exposure processes. The technologies described in Patent Documents 1 and 2 are not sufficient to perform such a local repair of multi-layer defects.

The present invention was made in view of the above-described circumstances and the object thereof is providing a method for locally improving EUV exposure intensity in the defective region.

Another object of the present invention is providing a mask for EUV exposure capable of suppressing the occurrence and severity of wafer level defects.

SUMMARY OF THE INVENTION

A first aspect of the present invention is a method for repairing a mask for EUV exposure including: a Mo/Si multi-layer film, which includes a molybdenum layer and a silicon layer and is deposited on a substrate; a protection film which is formed on the Mo/Si multi-layer film; and an absorption film which is formed on the protection film. The method includes: specifying a position of a defect of the Mo/Si multi-layer film in an exposed area of the protection film where the protection film is exposed from the absorption film; and irradiating energy beam onto an area covering the position of the defect in a plan view of the mask for EUV exposure to form a plurality of holes on a top surface of the mask for EUV exposure. A diameter of the energy beam is narrowed down to be at or less than a wavelength of EUV exposure light. The maximum width of the holes is equal to or less than the exposure wavelength.

It may be arranged such that the holes are formed so as to be aligned in a lattice at a predetermined interval with a pitch less than twice the wavelength in a plan view of the mask for EUV exposure.

It may be arranged such that the holes are formed such that the silicon layer of the Mo/Si multi-layer film is exposed at a bottom surface of the holes.

It may be arranged such that a shape of the defect is specified at the same time as the position of the defect of the Mo/Si multi-layer film in the exposed area of the protection film specified.

It may be arranged such that the area covering the position of the defect as well as a shape, the maximum width and the pitch of the holes in a plan view is determined based on the specified position and shape of the defect.

A second aspect of the present invention is a mask for EUV exposure including: a Mo/Si multi-layer film which includes a molybdenum layer and a silicon layer and is deposited on a substrate; a protection film which is formed on the Mo/Si multi-layer film; an absorption film which is formed on the protection film; and a reflectivity enhanced portion in an exposed area of the protection film where the protection film is exposed from the absorption film, in which a plurality of holes are formed, the maximum width of the holes being equal to or less than a wavelength of EUV exposure light.

It may be arranged such that in the reflectivity enhanced portion, the holes are aligned in a lattice at a predetermined interval with a pitch less than twice the wavelength.

Based on the method for repairing a mask for EUV exposure according to some aspects of the present invention, since local reduction of the irradiation light reflectivity in EUV exposure caused by defects in the Mo/Si multi-layer film can be improved, a defect repair can be preferably performed.

In addition, based on the mask for EUV exposure according to some aspects of the present invention, with the reflectivity enhanced portion, the reflectivity at the defect region can be locally improved and thereby suppress the occurrence and the degree of exposed images written on a wafer due to defects in the Mo/Si multi-layer film.

DETAILED DESCRIPTION OF THE PREFERRED EMBODIMENTS

An embodiment of the present invention will be described with reference to FIG. 1 to FIG. 6.

Figure 1:
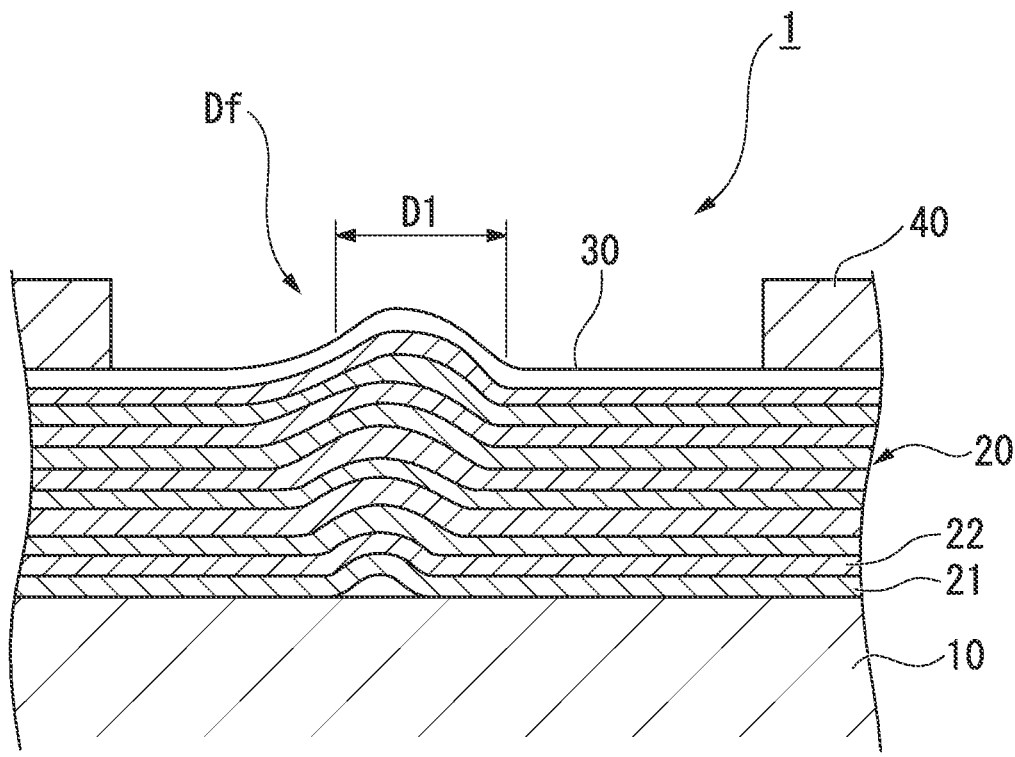
FIG. 1 is a cross-sectional view schematically showing an example of a mask for EUV exposure having defects.

FIG. 1 is a schematic view showing an example of a mask for EUV exposure having defects. The mask for EUV exposure 1 includes: a Mo/Si multi-layer film 20 formed on a transparent substrate 10 which is made, for example, of quartz; a protection film 30 formed on the Mo/Si multi-layer film 20; and an absorption film 40 formed on the protection film 30.

The Mo/Si multi-layer film 20 is formed by depositing a plurality pairs of molybdenum and silicon up to a film thickness of e.g., approximately 7 nm, each pair serving as a monolayer film. Since FIG. 1 schematically shows five pairs of molybdenum layer 21 and silicon layer 22, the number of the pair will be greater, e.g. 40 to 50 for practical use.

The protection film 30 is made, for example, of ruthenium (Ru) and is formed so as to cover the top surface of the Mo/Si multi-layer film 20. The absorption film 40 is formed by patterning the absorber layer formed on the protection film 30 to be in a desired shape. The absorption film 40 may be mainly made of tantalum (Ta) or chrome (Cr), and, in some cases, be a monolayer or a multilayer made of alloys containing silicon (Si). When the absorption film 40 is a multilayer, the top layer will be formed of the oxide, nitride, or oxynitride of the material.

In the mask for EUV exposure 1, a defect Df is present in an area where the absorption film 40 is removed to expose the protection film 30 (exposed area of the protection layer). At the defect Df, the parallel structure of the Mo/Si multi-layer film 20 and the protection film 30 on the film 20 is disrupted. In other words, the defect Df makes the Mo/Si multi-layer film 20 be thicker locally. In addition, a pit or divot defect in the surface of the substrate 30 can similarly disrupt the parallel structure of the Mo/Si multi-layer film 20 and the protection film 30 on the film 20.

Figure 2:
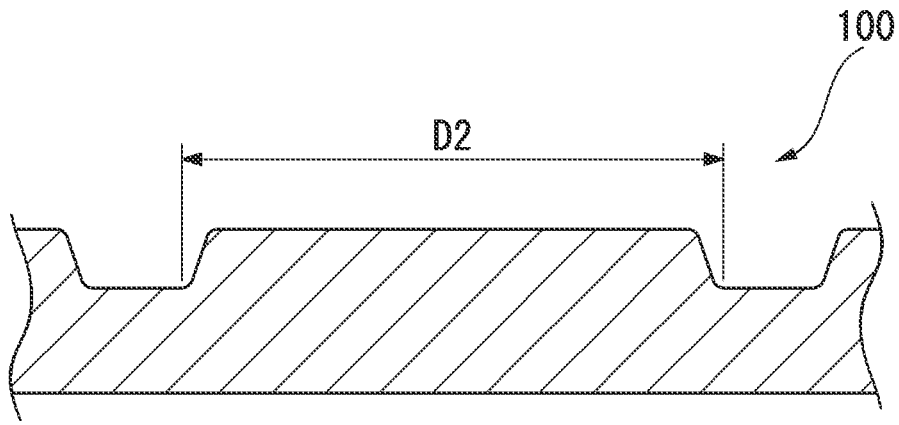
FIG. 2 is a cross-sectional view schematically showing the shape of a wafer to which printing is performed by exposure using the mask for EUV exposure.

Such the defect Df locally deteriorates the reflectivity of exposure light and can be found using usual defect inspection equipment. If printing is performed by irradiating exposure light onto the mask for EUV exposure 1 without repairing the defect Df, a reflective image of size D2 which is larger than size D1 of the defect Df in the planar direction will be printed to the wafer 100 as shown in FIG. 2. Even if the defect is locally present, it may be fatal.

The method for repairing a mask for EUV exposure (hereinafter, referred to as simply "repair method") according to the present embodiment is capable of preferably repairing defects on exposed areas of the protection layer, such as defect Df, by locally improving the reflectivity of exposure light.

Details will be explained below.

First, whether or not a defect is present in a mask for EUV exposure using a defect inspection equipment, and if a defect is found on the exposed area of the protection layer, the position and parameters as to the defect shape such as a projection height are specified.

Then, using converged ion beam, electron beam, light beam or similar energy beam of which the diameter is narrowed down to be at or less than the wavelength of EUV exposure light is irradiated on the top surface of the mask for EUV exposure 1 to form a plurality of holes in the exposed area of the protection layer of the mask for EUV exposure 1 including the defect Df. It is preferable to form the holes such that the silicon layer of the Mo/Si multi-layer film 20 is exposed at the bottom surface of the holes. Assist gas used with converged ion beam or electron beam may be preferably selected from gases listed in the following Table 1 for example.

TABLE 1

| Repair device | Assist gas |
| --- | --- |
| Ion beam | Xenon fluoride |
| Electron beam | Iodine |
| | Chlorine |
| | Tetrafluoromethane |
| | Trifluoromethane |
| | Chloroform |
| | Tetrachloromethane |
| | Tetrachloroethylene |
| | Chlorine trifluoride |

Figure 3:
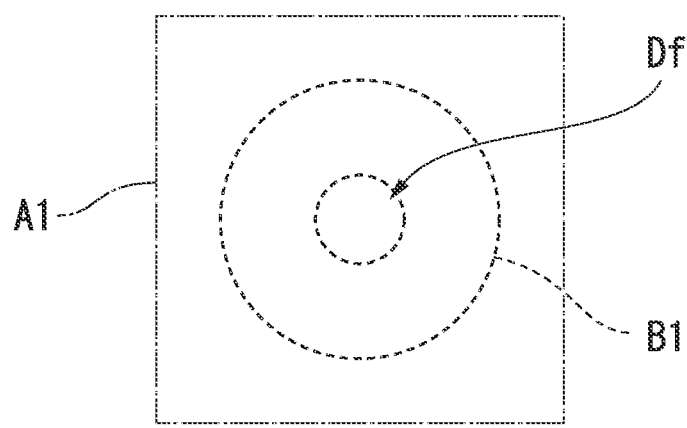
FIG. 3 is a view showing the relationship between the defect region and a region where the reflectivity enhanced portion is formed.

An area A1 in which the holes are formed is determined such that the area A1 completely covers, in a plan view of the mask for EUV exposure 1, an area B1 where deformation occurs due to the defect Df as shown in FIG. 3.

Figure 4:
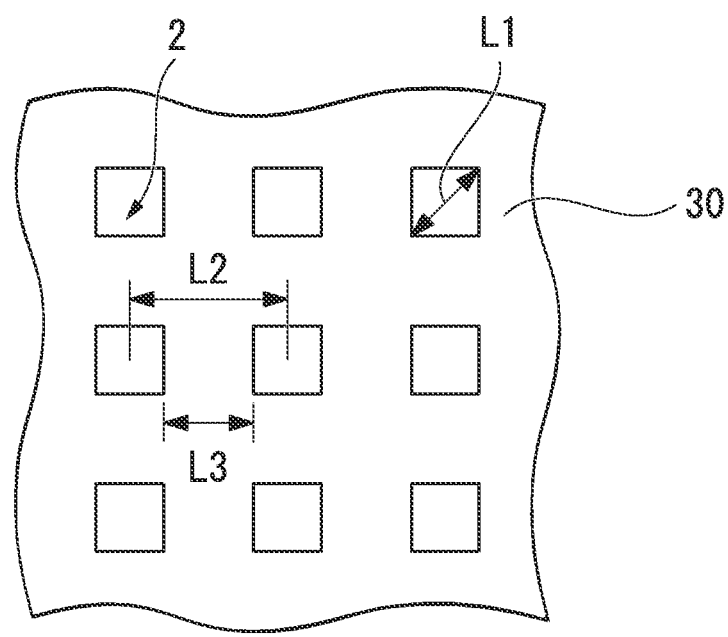
FIG. 4 is a view showing an example of alignment of holes at the reflectivity enhanced portion and the reflective image with the corrected mask for EUV exposure.

FIG. 4 is a view showing an example of alignment of the formed holes 2 in the area A1. The maximum width L1 of the holes 2 are determined to be a value which is less than the wavelength of exposure light. In FIG. 4, the holes 2 are substantially square-shaped in a plan view, but the shape is not limited thereto. The holes 2 may be substantially ellipse-shaped. The minimum distance L3 between adjacent holes 2 is determined to be a predetermined value which is less than the wavelength of exposure light, for example. Accordingly, the pitch L2 of the holes 2 defined by the distance between the center of adjacent holes 2 will be determined to be a predetermined value which is less than twice the wavelength of exposure light.

Figure 5:
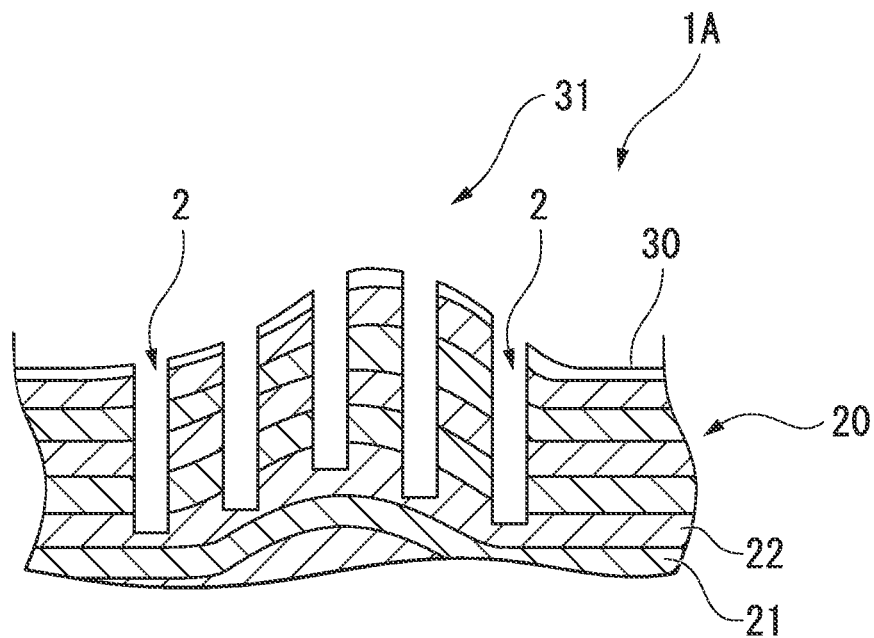
FIG. 5 is a cross-sectional view schematically showing a mask for EUV exposure formed with a reflectivity enhanced portion according to an embodiment of the present invention.

As shown in FIG. 5, when a plurality of the holes 2 are formed to show a predetermined pattern in a plan view using converged ion beam or electron beam, a reflectivity enhanced portion 31 including a plurality of the holes 2 is formed in the area A1 which is part of the exposed area of the protection film 30, thereby obtaining the mask for EUV exposure 1A according to the present embodiment.

Figure 6:
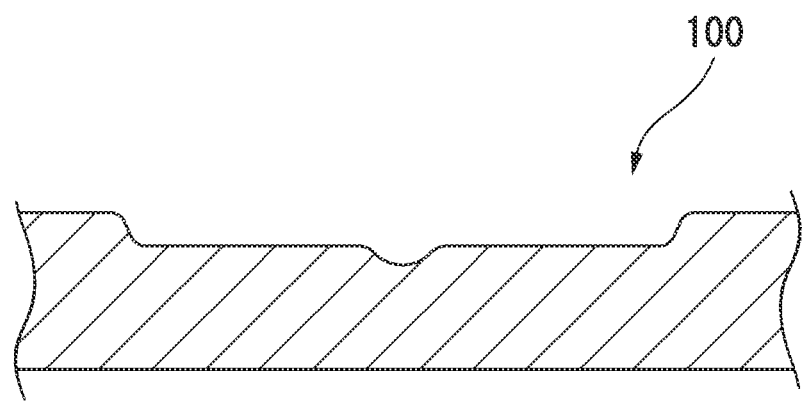
FIG. 6 is a cross-sectional view schematically showing the shape of a wafer to which printing is performed by exposure using the mask for EUV exposure.

The reflectivity of the area A1 where the reflectivity enhanced portion 31 is formed is higher than that of the other part of the exposed area of the protection layer. Therefore, the formation of the reflectivity enhanced portion 31 in an area where the defect Df is present makes it possible to correct local reduction of the reflectivity due to the defect Df. As a result, the defect Df is preferably corrected, and thus it is possible, as shown in FIG. 6, to substantially prevent its reflective image from being formed on the wafer 100 and/or make the image be sufficiently small so as not to adversely affect the quality of the product.

Parameters for forming the reflectivity enhanced portion 31 such as: the shape and size of the area A1; and the planar shape, the maximum width, and the pitch of the holes 2 are specified based on the parameters as to the shape of the defect Df specified as described above, and may be calculated and determined using simulation or the like.

An embodiment of the present invention is explained above; however, the present invention is not to be considered as being limited by the foregoing embodiments. Modifications and omissions of the configurations can be made without departing from the scope of the present invention.

For example, the repair method according to the present invention may be applied to an area where substantial defects are not present but local reduction of the reflectivity occurs or the method can be applied where a local reflectivity increase is desired. Thus, it is possible to perform repair to locally improve the reflectivity of the area.

A method for repairing a mask for EUV exposure according to the embodiments of the present invention can be widely used in the field of photolithography.

What is claimed is:

1. A method for repairing a mask for EUV exposure comprising: a Mo/Si multi-layer film which includes a molybdenum layer and a silicon layer and is deposited on a substrate; a protection film which is formed on the Mo/Si multi-layer film; and an absorption film which is formed on the protection film, the method comprising:
    specifying a position of a defect of the Mo/Si multi-layer film in an area of the protection film where the protection film is not covered by the absorption film; and
    irradiating energy beam, of which a diameter is narrowed down to be at or less than a wavelength of EUV exposure light, onto an area covering the position of the defect in a plan view of the mask for EUV exposure to form a reflectivity enhanced portion having plurality of holes on a top surface of the mask for EUV exposure, the plurality of holes being in the protection film and extending to the Mo/Si multi-layer film, and the maximum width of the holes being equal to or less than the wavelength.

2. The method for repairing a mask for EUV exposure according to claim 1, wherein the holes are formed so as to be aligned in a lattice at a predetermined interval with a pitch less than twice the wavelength in a plan view of the mask for EUV exposure.

3. The method for repairing a mask for EUV exposure according to claim 1, wherein the holes are formed such that the silicon layer of the Mo/Si multi-layer film is exposed at a bottom surface of the holes.

4. The method for repairing a mask for EUV exposure according to claim 1, wherein a shape of the defect is specified at the same time as the position of the defect of the Mo/Si multi-layer film in the exposed area of the protection film specified.

5. The method for repairing a mask for EUV exposure according to claim 4, wherein the area covering the position of the defect as well as a shape, the maximum width and the pitch of the holes in a plan view is determined based on the specified position and shape of the defect.

6. A mask for EUV exposure comprising:
    a Mo/Si multi-layer film which includes a molybdenum layer and a silicon layer and is deposited on a substrate;
    a protection film which is formed on the Mo/Si multi-layer film;
    an absorption film which is formed on the protection film; and
    a reflectivity enhanced portion in an area of the protection film where the protection film is not covered by the absorption film, the reflectivity enhanced portion having a plurality of holes formed in the protection film, the holes extending to the Mo/Si multi-layer film, and a maximum width of the holes being equal to or less than a wavelength of EUV exposure light.

7. The mask for EUV exposure according to claim 6 wherein, in the reflectivity enhanced portion, the holes are aligned in a lattice at a predetermined interval with a pitch less than twice the wavelength.

* * * * *